(12) United States Patent
Lee et al.

(10) Patent No.: US 10,945,064 B2
(45) Date of Patent: *Mar. 9, 2021

(54) INNER MODULE USED IN A WIRELESS EARPHONE

(71) Applicant: CONCRAFT HOLDING CO., LTD., Grand Cayman (KY)

(72) Inventors: Chin-Hsing Lee, New Taipei (TW); Jin-Bo Peng, Kunshan (CN); Chang-Hsien Tung, New Taipei (TW)

(73) Assignee: CONCRAFT HOLDING CO., LTD., Grand Cayman (KY)

( * ) Notice: Subject to any disclaimer, the term of this patent is extended or adjusted under 35 U.S.C. 154(b) by 50 days.

This patent is subject to a terminal disclaimer.

(21) Appl. No.: 16/366,032

(22) Filed: Mar. 27, 2019

(65) Prior Publication Data

US 2020/0204900 A1 Jun. 25, 2020

(30) Foreign Application Priority Data

Dec. 20, 2018 (TW) .................................. 107146200

(51) Int. Cl.
  *H05K 1/11* (2006.01)
  *H04R 1/10* (2006.01)
  *H05K 1/02* (2006.01)
(52) U.S. Cl.
  CPC ......... *H04R 1/1058* (2013.01); *H05K 1/0213* (2013.01); *H04R 2420/07* (2013.01)

(58) Field of Classification Search
  CPC . H04R 1/1058; H04R 2420/07; H05K 1/0213
  See application file for complete search history.

(56) References Cited

U.S. PATENT DOCUMENTS

| | | | | |
|---|---|---|---|---|
| 9,888,309 | B2 * | 2/2018 | Prelogar | H04R 1/1041 |
| 2008/0311966 | A1 * | 12/2008 | Klein | H04R 1/1025 |
| | | | | 455/575.2 |
| 2010/0041447 | A1 * | 2/2010 | Graylin | G10L 15/26 |
| | | | | 455/575.2 |
| 2011/0164776 | A1 * | 7/2011 | Kelly | H04R 1/1016 |
| | | | | 381/379 |
| 2014/0098983 | A1 * | 4/2014 | Clow | H04R 1/10 |
| | | | | 381/375 |
| 2020/0204897 | A1 * | 6/2020 | Lee | H04R 1/1016 |

* cited by examiner

*Primary Examiner* — Yuriy Semenenko
(74) *Attorney, Agent, or Firm* — Muncy, Geissler, Olds & Lowe, P.C.

(57) ABSTRACT

An inner module used in a wireless earphone is installed primarily in a wireless earphone, including a circuit loop and an upper cover. The circuit loop includes at least a first circuit board, at least a second circuit board which is extended from the first circuit board, and a lower cover which encloses the first circuit board. The upper cover is installed on the lower cover, including a first side wall which forms an angle with respect to the lower cover. In addition, the first side wall is provided with a first positioning slot to accommodate the second circuit board. Therefore, the inner module is formed into a modularized design to simplify the assembly procedure of the wireless earphone, which reduces the labor cost in assembling the wireless earphone significantly.

10 Claims, 7 Drawing Sheets

INNER MODULE USED IN A WIRELESS EARPHONE

BACKGROUND OF THE INVENTION a) Field of the Invention

The present invention relates to an inner module, and more particularly to an inner module which is installed in a wireless earphone by a modularized design and is able to reduce the assembly cost significantly.

b) Description of the Prior Art

An earphone is connected to an electronic device, so as to transmit the sound played by that electronic device to a user's ears. An ordinary earphone includes a wired earphone and a wireless earphone (such as the AIRPODS issued by the Apple, Inc.), wherein the wired earphone is connected to the electronic device through a wire, and the wireless earphone is connected to the electronic device through a wireless communication technology such as Bluetooth.

As the wired earphone must use a wire to connect to the electronic device, the range of use is limited. In addition, the wired earphone can be pulled and stretched easily due to the existence of wire, and the wire can be easily intertwined upon collecting the wired earphone. On the other hand, as the wireless earphone transmits the sound through the wireless communication technology, the range of use is farther than that of the wired earphone, and is without the problem of easy pulling and stretching or intertwining of the wire. Therefore, the wireless earphone has been replacing the wired earphone gradually.

For an ordinary earphone, in addition to that its exterior is enclosed by a casing, the interior is usually provided with a circuit board, and a loudspeaker; whereas, the interior of the wireless earphone should be further provided with a battery, a microphone and a wireless communication module. As a wireless earphone has more internal parts, when the ordinary wireless earphone is being assembled, the circuit board, the loudspeaker, the battery, the microphone, and the wireless communication module should be installed and fixed inside the casing orderly. Therefore, it will require a lot of manpower to assemble the wireless earphone, which increases the labor cost. Furthermore, as the wireless earphone is small in size, the internal space of assembly is limited, which can easily damage the parts by carelessly assembling, thereby decreasing the yield of assembly.

Accordingly, the technical means and the object thereof to be solved by the present invention are the provision of an inner module which is installed inside a wireless earphone by a modularized design and is able to reduce the assembly cost significantly.

SUMMARY OF THE INVENTION

The primary object of the present invention is to provide an inner module, and more particularly to an inner module which is installed in a wireless earphone by a modularized design and is able to reduce the assembly cost significantly.

To achieve the aforementioned object, the present invention discloses an inner module used in a wireless earphone, comprising a circuit loop and an upper cover. The circuit loop includes at least a first circuit board, at least a second circuit board which is extended from the first circuit board, and a lower cover which encloses the first circuit board. The upper cover is installed on the lower cover, including at least a first side wall which forms an angle with respect to the lower cover. In addition, the first side wall is provided with a first positioning slot to accommodate the second circuit board, thereby forming a modularized design to the inner module to simplify the assembly procedure of the wireless earphone and reduce the labor cost in assembling the wireless earphone considerably.

In an embodiment, the upper cover further includes a second side wall which is opposite to the first side wall, as well as a connecting wall which is connected between the first side wall and the second side wall, forming a holding space between the upper cover and the lower cover.

In an embodiment, the inner module is further provided with a power supply unit which is disposed in the holding space to connect electrically with the circuit loop.

In an embodiment, the circuit loop further includes a third circuit board which is extended from the first circuit board to oppose the second circuit board, and the second side wall of the upper cover is further provided with a second positioning slot to accommodate the third circuit board, so that after the third circuit board is installed in the second positioning slot, the third circuit board is opposite to the second circuit board.

In an embodiment, at least a first latching mechanism is further disposed between the second circuit board and the first positioning slot to latch the second circuit board and the first positioning slot together, allowing the second circuit board to be fixed in the first positioning slot through the first latching mechanism. On the other hand, at least a second latching mechanism is further disposed between the third circuit board and the second positioning slot to latch the third circuit board and the second positioning slot together, allowing the third circuit board to be fixed in the second positioning slot through the second latching mechanism.

In comparison to the prior arts, the inner module used in a wireless earphone, according to the present embodiment, is provided with following advantages that:

1. Through the upper cover and the lower cover, the circuit loop, the power supply unit and the loudspeaker can be integrated together in advance, forming a modularized inner module to reduce the labor cost in assembling the wireless earphone significantly.
2. The shapes of the upper cover and the lower cover can be changed according to the configuration of the wireless earphone, so that the inner module can be applied to the wireless earphones in various configurations.

To achieve the abovementioned object, the present invention also discloses an inner module used in a wireless earphone, comprising a circuit loop and an insulation seat. The circuit loop includes at least a first circuit board and at least a second circuit board which is extended from the first circuit board. The insulation seat is formed on the first circuit board, including a lower cover which encloses the first circuit board, and an upper cover which is extended from the lower cover to form a holding space. The upper cover includes a first side wall which is extended from the lower cover, a second side wall which is extended from the lower cover to oppose the first side wall, and a connecting wall which connects the first side wall and the second side wall to oppose the lower cover. In addition, the first side wall is provided with a first positioning slot to accommodate the second circuit board, thereby forming a modularized design to the inner module to simplify the assembly procedure of the wireless earphone and reduce the labor cost in assembling the wireless earphone considerably.

In an embodiment, the inner module further includes a power supply unit which is disposed in the holding space to connect electrically with the circuit loop.

In an embodiment, the circuit loop further includes a third circuit board which is extended from the first circuit board to oppose the second circuit board, and the second side wall of the insulation seat further includes a second positioning slot to accommodate the third circuit board.

In an embodiment, at least a first latching mechanism is further disposed between the second circuit board and the first positioning slot to latch the second circuit board and the first positioning slot together, allowing the second circuit board to be fixed in the first positioning slot through the first latching mechanism. On the other hand, at least a second latching mechanism is further disposed between the third circuit board and the second positioning slot to latch the third circuit board and the second positioning slot together, allowing the third circuit board to be fixed in the second positioning slot through the second latching mechanism.

In an embodiment, the inner module is further provided with a loudspeaker which is connected electrically with the circuit loop, and the connecting wall of the insulation seat is further provided with a rabbet to dispose the loudspeaker.

In comparison to the prior arts, the inner module used in a wireless earphone, according to the present embodiment, is provided with following advantages that:

1. Through the insulation seat, the circuit loop, the power supply unit and the loudspeaker can be integrated together directly, forming a modularized inner module to reduce the labor cost in assembling significantly.
2. The shape of the insulation seat can be changed according to the configuration of the wireless earphone, so that the inner module can be applied to the wireless earphones in various configurations.

To enable a further understanding of said objectives and the technological methods of the invention herein, a brief description of the drawings is provided below followed by a detailed description of the preferred embodiments.

DETAILED DESCRIPTION OF THE PREFERRED EMBODIMENTS

Figure 1:
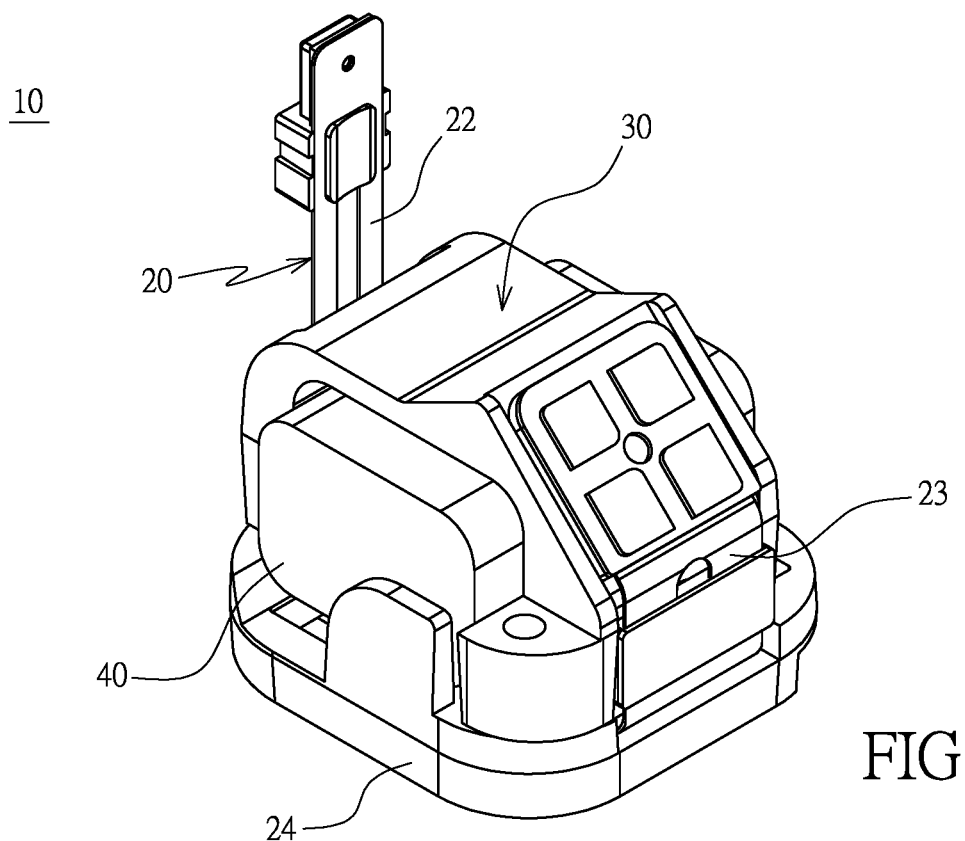
FIG. 1 shows a reference diagram at a first viewing angle for a first embodiment of the present invention in a usage state.
Figure 2:
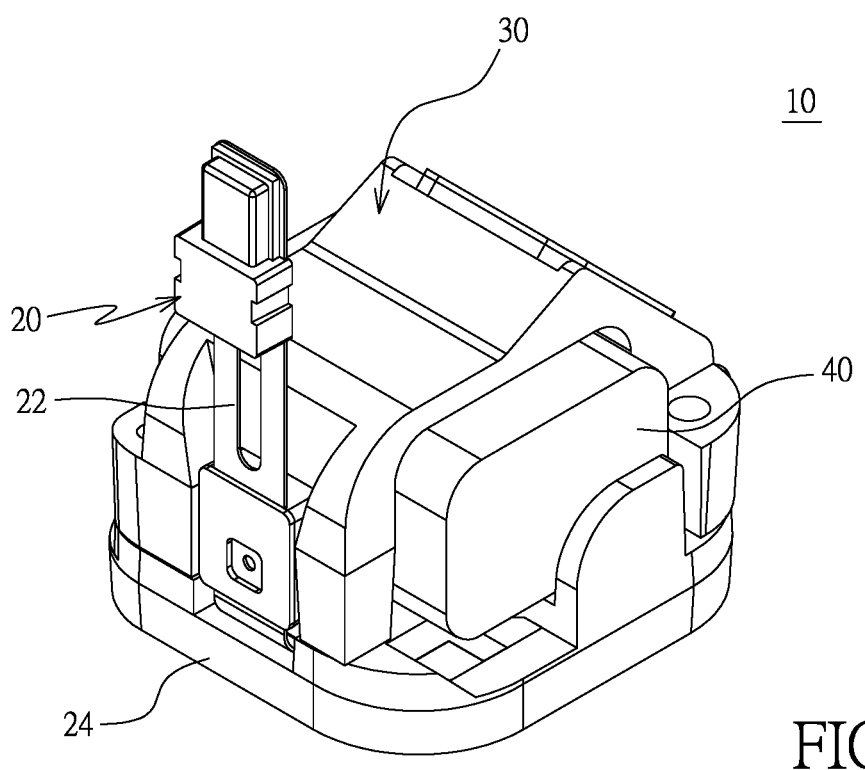
FIG. 2 shows a reference diagram at a second viewing angle for the first embodiment of the present invention in the usage state.
Figure 3:
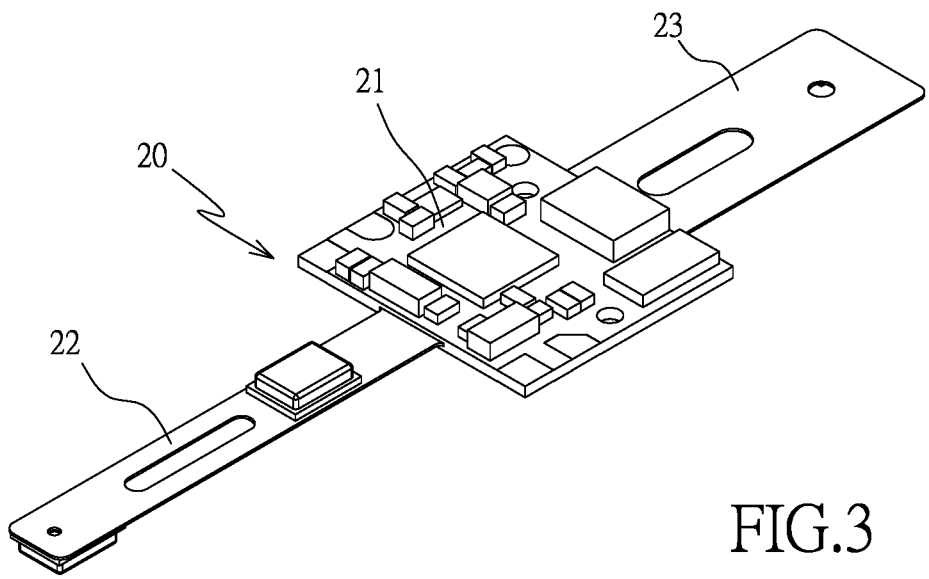
FIG. 3 shows a three-dimensional schematic view of a circuit loop in the present invention.
Figure 4:
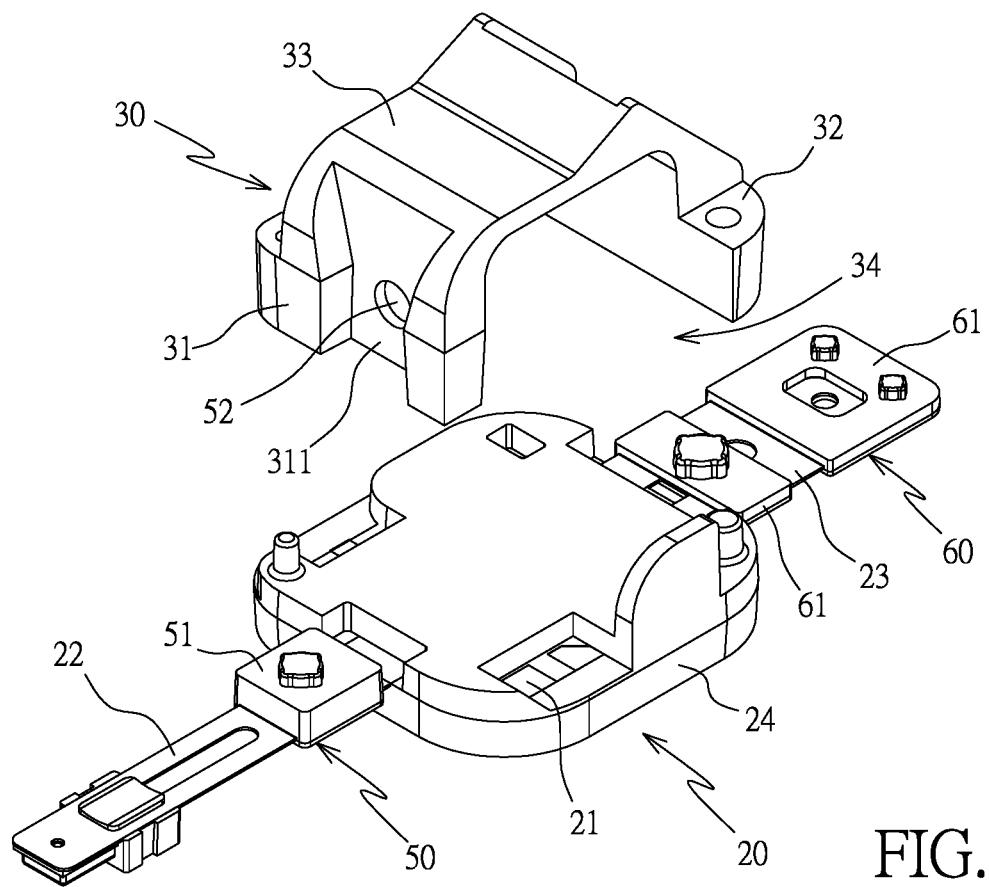
FIG. 4 shows a schematic view at a first viewing angle of the first embodiment of the present invention where the circuit loop is separated from an upper cover.
Figure 5:
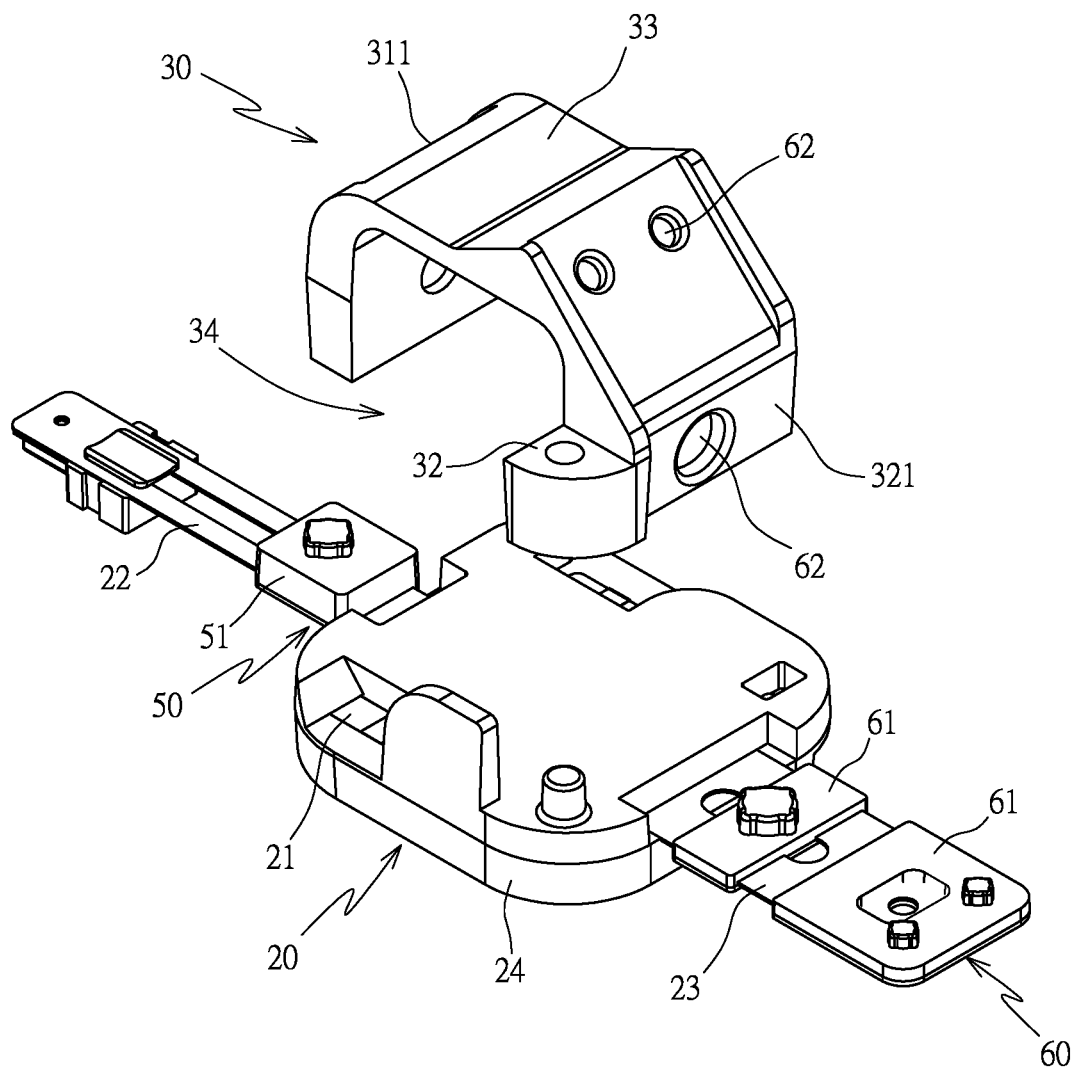
FIG. 5 shows a schematic view at a second viewing angle of the first embodiment of the present invention where the circuit loop is separated from the upper cover.

Referring to FIGS. 1 to 5, the present invention discloses an inner module 10 used in a wireless earphone which is installed in a casing of wireless earphone (no further description is needed as it belongs to the prior arts), comprising a circuit loop 20, an upper cover 30, and a power supply unit 40.

The circuit loop 20 is constituted by a first circuit board 21, a second circuit board 22, a third circuit board 23, and a lower cover 24. The first circuit board 21 is a hard circuit board; whereas, the second circuit board 22 and the third circuit board 23 are a soft circuit board respectively, with that the second circuit board 22 and the third circuit board 23 are extended from two opposite sides of the first circuit board 21, enabling the second circuit board 22 to oppose the third circuit board 23. The lower cover 24 is formed directly on the first circuit board 21 by injection molding to enclose the first circuit board 21, and allows part of junctions on the first circuit board 21 to be exposed above and below the lower cover 24, and enables the second circuit board 22 and the third circuit board 23 to be extended out of the two opposite sides of the lower cover 24. In addition to that the circuit loop 20 is constituted by the hard circuit board and the soft circuit boards, the circuit loop 20 can be also formed by the soft circuit boards alone or the hard circuit boards alone. Furthermore, the first circuit board 21, the second circuit board 22 and the third circuit board 23 are connected electrically together.

The upper cover 30 is disposed on the lower cover 24, including a first side wall 31, a second side wall 32, and a connecting wall 33 which is connected between the first side wall 31 and the second side wall 32. The first side wall 31 is opposite to the second side wall 32, and when the upper cover 30 is disposed on the lower cover 24, a holding space 34 is formed between the lower cover 24 and the upper cover 30 to dispose the power supply unit 40. The first side wall 31 is further provided with a first positioning slot 311 to accommodate the second circuit board 22, and the second side wall 32 is further provided with a second positioning slot 321 to accommodate the third circuit board 23.

Upon assembling, the first circuit board 21 is first formed on the lower cover 24, and then the upper cover 30 is installed on the lower cover 24 to form the holding space 34, enabling an energized surface (not shown in the drawings) of the first circuit board 21 to be exposed in the holding space 34, and assembling the upper cover 30 with the lower cover 24 by latching the upper cover 30 and the lower cover 24 together.

Next, the second circuit board 22 and the third circuit board 23 are bent over orderly with respect to the first circuit board 21, followed by being installed in the first positioning slot 311 and the second positioning slot 321 respectively. In order to allow the second circuit board 22 and the third circuit board 23 to be actually installed in the first positioning slot 311 and the second positioning slot 321, at least a first latching mechanism 50 is disposed between the second circuit board 22 and the first positioning slot 311 to latch the second circuit board 22 and the first positioning slot 311 together, and at least a second latching mechanism 60 is disposed between the third circuit board 23 and the second positioning slot 321 to latch the third circuit board 23 and the second positioning slot 321 together (in the present embodiment, two second latching mechanisms 60 are disposed between the third circuit board 23 and the second positioning slot 321). Each first latching mechanism 50 includes at least a first latching bump 51 which is protruded on the second circuit board 22, and at least a first latching groove 52 which is concaved in the first positioning slot 311 to oppose the first latching bump 51. Each second latching mechanism 60 includes at least a second latching bump 61 which is protruded on the third circuit board 23, and at least a second latching groove 62 which is concaved in the second positioning slot 321 to oppose the second latching bump 61. In addition, the first latching mechanism 50 and the second latching mechanism 60 are latched together by tight fitting or interference, so that the second circuit board 22 and the third circuit board 23 can be fixed effectively in the first positioning slot 311 and the second positioning slot 321, respectively. On the other hand, the first latching bump 51 and the second latching bump 61 are directly formed on the second circuit board 22 and the third circuit board 23 by injection molding. Accordingly, the steps and procedure for assembling the second circuit board 22 and the third circuit board 23 with the first positioning slot 311 and the second positioning slot 321 can be simplified significantly.

Finally, the power supply unit 40 is installed in the holding space 34, and is made to connect electrically with the first circuit board 21. Accordingly, the inner module 10 in the modularized design is accomplished. Furthermore, when the inner module 10 is installed in a casing of the wireless earphone, the wireless earphone is assembled only by installing the modularized inner module 10 in the casing directly, which simplifies the assembly procedure of the wireless earphone considerably and decreases the manpower in assembling the wireless earphone significantly, thereby reducing the assembly cost.

Figure 6:
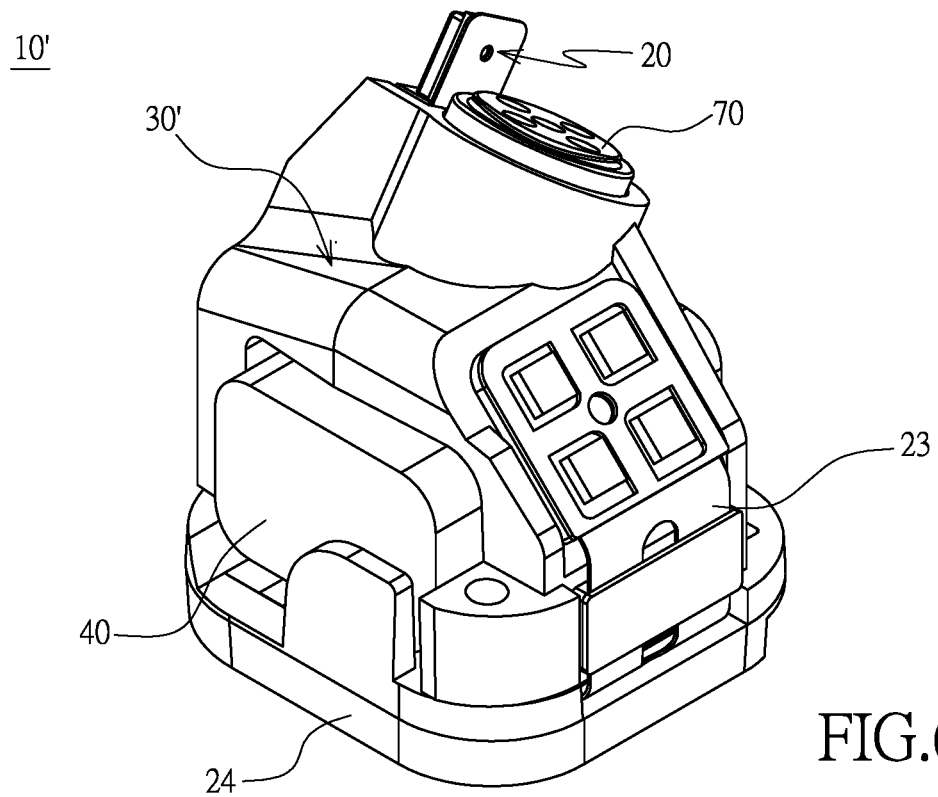
FIG. 6 shows a reference diagram at a first viewing angle for a second embodiment of the present invention in a usage state.
Figure 7:
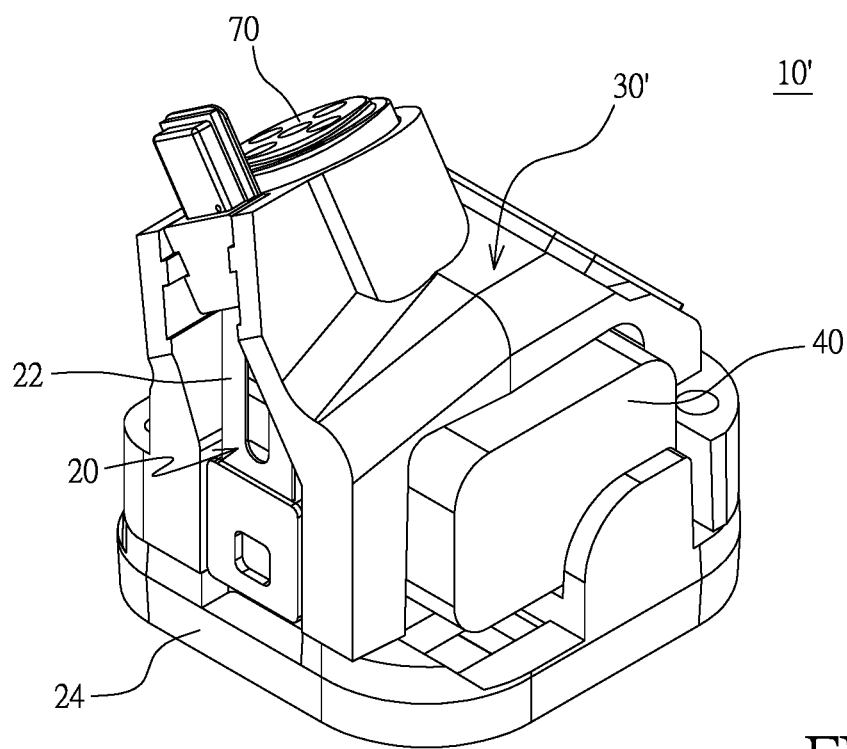
FIG. 7 shows a reference diagram at a second viewing angle for the second embodiment of the present invention in the usage state.
Figure 8:
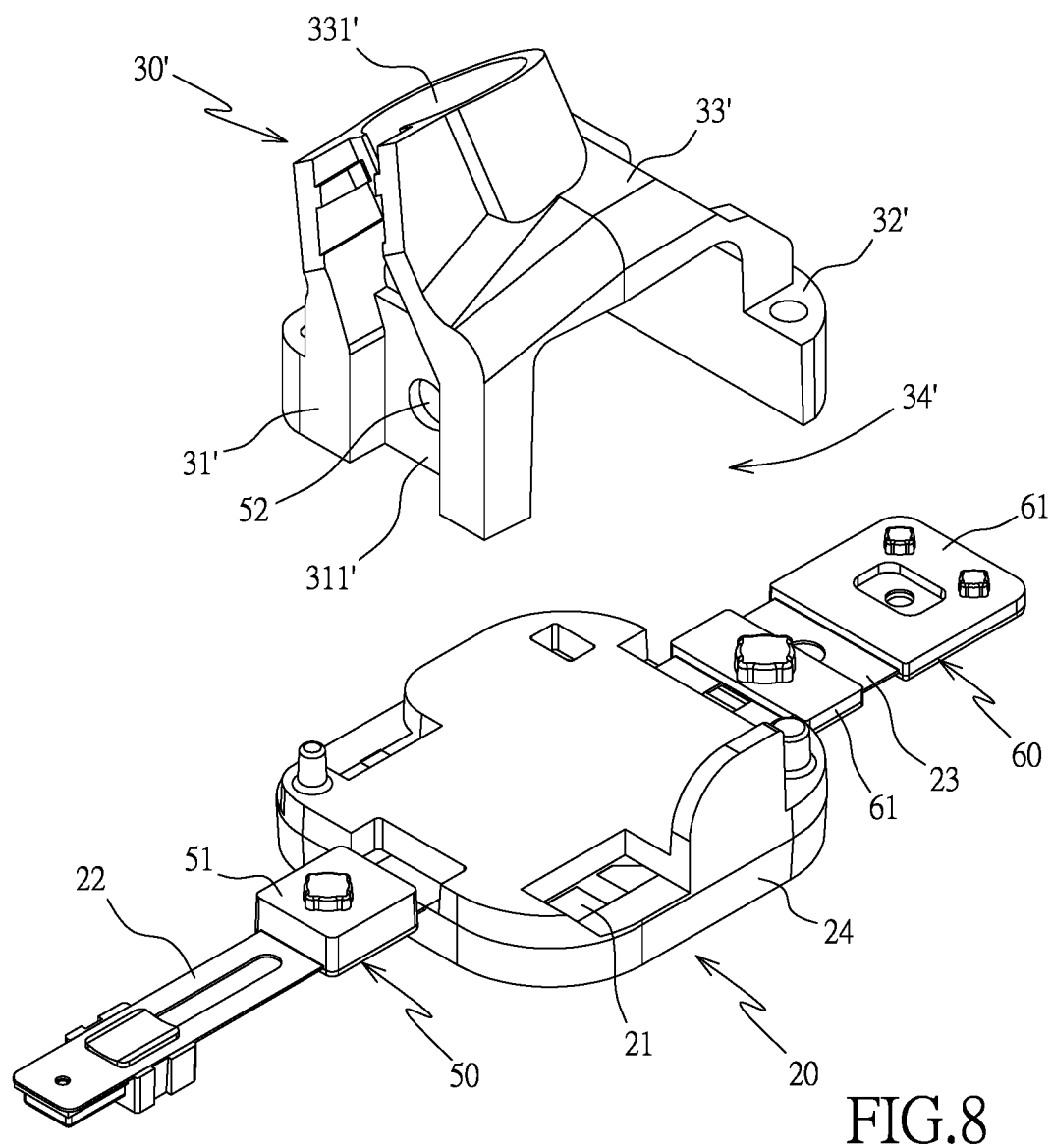
FIG. 8 shows a schematic view at a first viewing angle of the second embodiment of the present invention where the circuit loop is separated from the upper cover.
Figure 9:
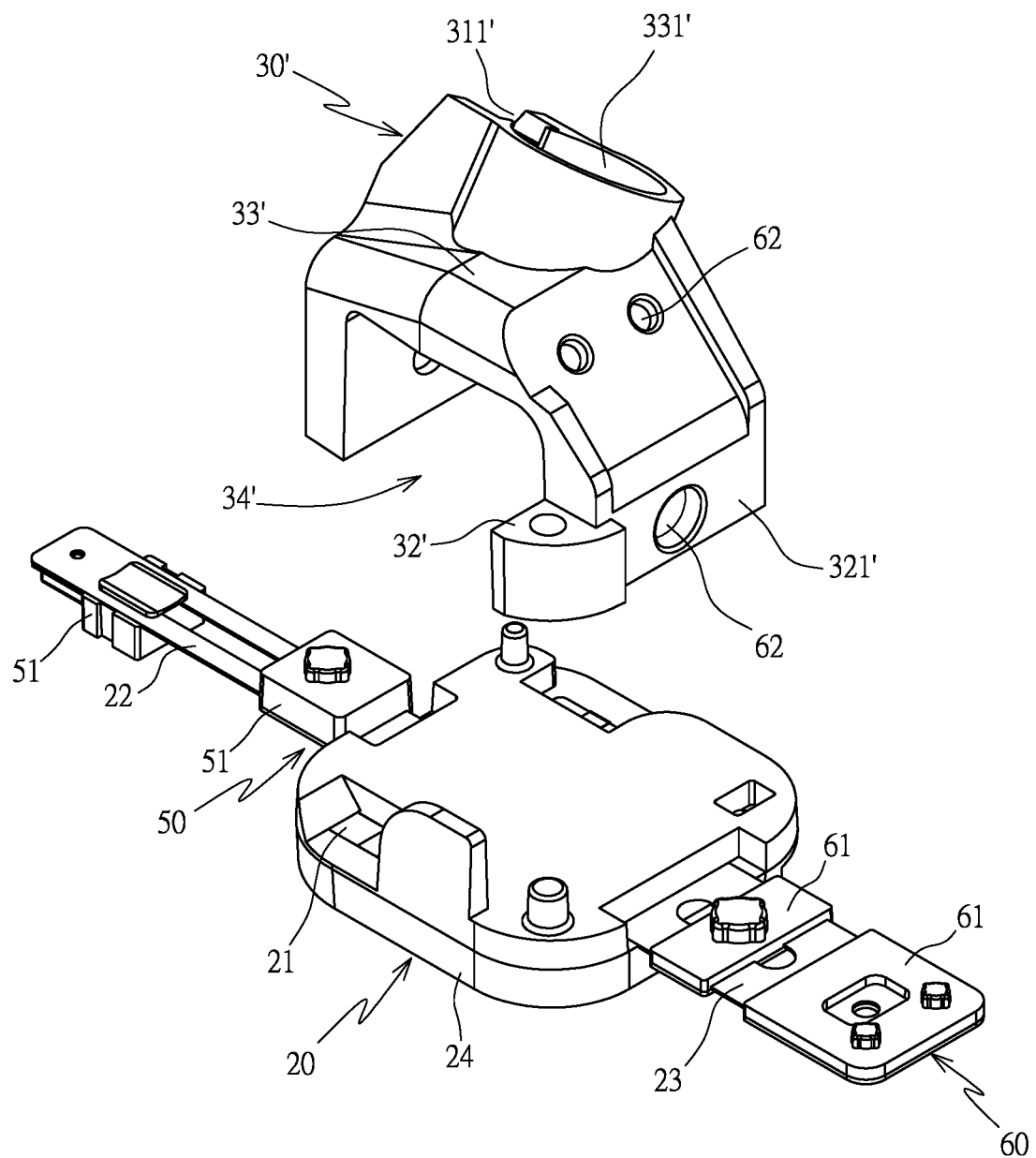
FIG. 9 shows a schematic view at a second viewing angle of the second embodiment of the present invention where the circuit loop is separated from the upper cover.

Referring to FIG. 3, and FIGS. 6 to 9, in the present embodiment, an inner module 10' comprises the circuit loop 20, an upper cover 30', the power supply unit 40 and a loudspeaker 70.

The circuit loop 20 is also constituted by the first circuit board 21, the second circuit board 22, the third circuit board 23 and the lower cover 24. The upper cover 30' also includes a first side wall 31', a second side wall 32', and a connecting wall 33' which is connected between the first side wall 31' and the second side wall 32'. On the other hand, the connecting wall 33' is further provided with a rabbet 331' to accommodate the loudspeaker 70.

Upon assembling, the first circuit board 21 of the circuit loop 20 is first formed on the lower cover 24 by injection molding, and then the upper cover 30' is installed on the lower cover 24, so as to form a holding space 34' between the lower cover 24 and the upper cover 30'. Next, the second circuit board 22 is latched in a first positioning slot 311', and the third circuit board 23 is latched in a second positioning slot 321', followed by installing the power supply unit 40 in the holding space 34', and connecting the power supply unit 40 with the circuit loop 20 electrically. Finally, the loudspeaker 70 is installed in the rabbet 331', and the loudspeaker 70 is made to connect with the circuit loop 20 electrically. Accordingly, the loudspeaker 70 can be fixed effectively on the upper cover 30' to connect with the circuit loop 20 electrically, thereby accomplishing the assembling of the inner module 10'.

On the other hand, in the present embodiment, two first latching mechanisms 50 are disposed between the second circuit board 22 and the first positioning slot 311'. The second circuit board 22 is provided with two first latching bumps 51, and a first latching groove 52 is disposed in the first positioning slot 311' at a location opposite to each first latching bump 51, so that the second circuit board 22 can be fixed in the first positioning slot 311' more effectively through the two first latching mechanisms 50, thereby preventing the second circuit board 22 from dropping out of the first positioning slot 311'.

Figure 10:
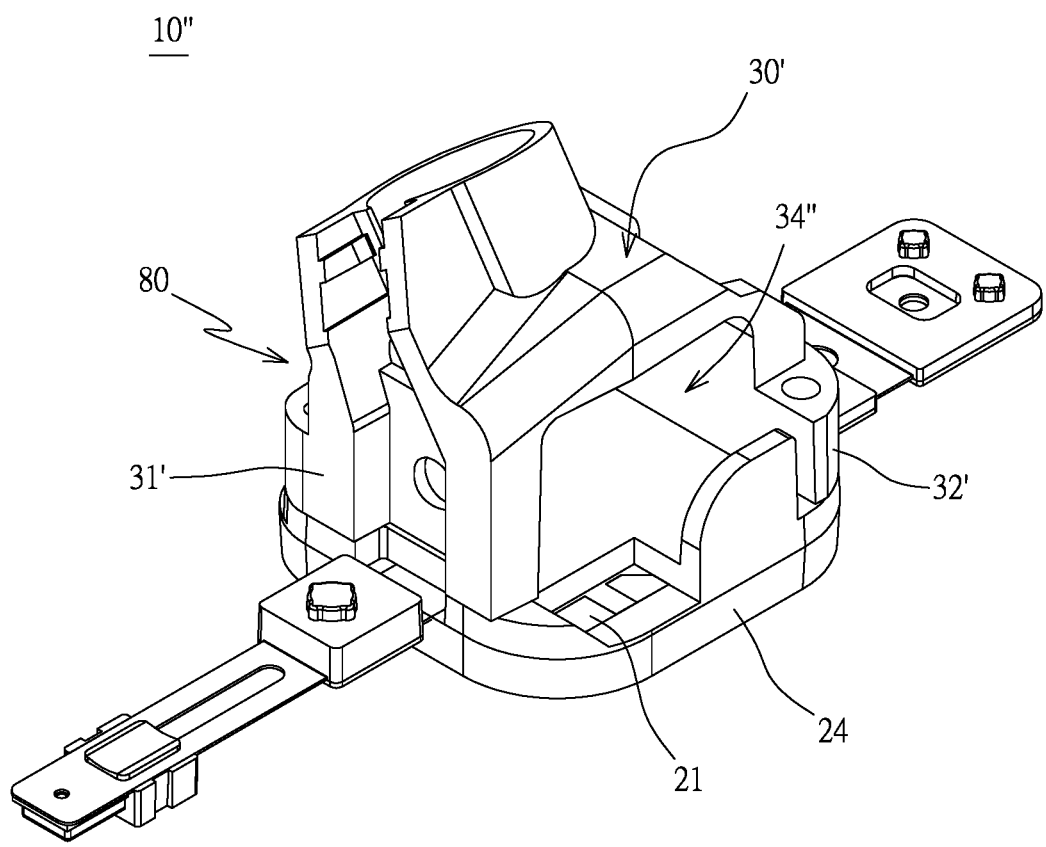
FIG. 10 shows a three-dimensional schematic view of a third embodiment of the present invention.

Moreover, referring to FIG. 3, and FIGS. 7 to 10, in the present embodiment, the first circuit board 21 of the circuit loop 20 is directly formed with an insulation seat 80 having a holding space 34" by injection molding. In other words, the insulation seat 80 includes the lower cover 24 and the upper cover 30', and the upper cover 30' is formed by extending from the lower cover 24 integrally, which means that the first side wall 31' and the second side wall 32' are extended from the lower cover 24 to oppose each other, and the connecting wall 33' connects the first side wall 31' and the second side wall 32' to oppose the lower cover 24.

As the insulation seat 80 is directly formed on the first circuit board 21, after the insulation seat 80 is formed, the second circuit board 22 is fixed in the first positioning slot 311' through the two first latching mechanisms 50, and the third circuit board 23 is fixed in the second positioning slot 321' through the two second latching mechanisms 60, followed by installing the power supply unit 40 in the holding space 34" to connect with the circuit loop 20 electrically. Finally, the loudspeaker 70 is installed in the rabbet 331' to connect with the circuit loop 20 electrically, thereby accomplishing the assembling of the inner module 10". Accordingly, the assembly procedure of the inner module 10" can be simplified considerably, and the second circuit board 22 and the third circuit board 23 can be prevented from dropping out of the insulation seat 80.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. An inner module used in a wireless earphone, comprising
   a circuit loop, which is provided with a first circuit board, a second circuit board extending from the first circuit board, and a lower cover enclosing the first circuit board; and
   an upper cover, which is installed on the lower cover and is provided with a first side wall forming an angle with respect to the lower cover, with the first side wall being provided with a first positioning slot to accommodate the second circuit board.

2. The inner module used in a wireless earphone, according to claim 1, wherein the upper cover further includes a second side wall which is opposite to the first side wall, and a connecting wall which is connected between the first side wall and the second side wall, forming a holding space between the upper cover and the lower cover.

3. The inner module used in a wireless earphone, according to claim 2, wherein the inner module further comprises a power supply unit which is disposed in the holding space, and the power supply unit is connected with the circuit loop electrically.

4. The inner module used in a wireless earphone, according to claim 2, wherein the circuit loop further includes a third circuit board which is extended from the first circuit board to oppose the second circuit board, and the second side wall of the upper cover further includes a second positioning slot to accommodate the third circuit board, enabling the third circuit board to opposite the second circuit board after being installed in the second positioning slot.

5. The inner module used in a wireless earphone, according to claim 4, wherein a first latching mechanism is further disposed between the second circuit board and the first positioning slot to latch the second circuit board and the first positioning slot together, allowing the second circuit board to be fixed in the first positioning slot through the first latching mechanism; and a second latching mechanism is further disposed between the third circuit board and the second positioning slot to latch the third circuit board and the second positioning slot together, allowing the third circuit board to be fixed in the second positioning slot through the second latching mechanism.

6. An inner module used in a wireless earphone, comprising
a circuit loop, which includes a first circuit board and a second circuit board extending from the first circuit board; and
an insulation seat, which is formed on the first circuit board and includes a lower cover to enclose the first circuit board, as well as an upper cover extending from the lower cover to form a holding space, with the upper cover being provided with a first side wall extending from the lower cover, a second side wall extending from the lower cover to oppose the first side wall, and a connecting wall connecting the first side wall and the second side wall to oppose the lower cover, with the first side wall being provided with a first positioning slot to accommodate the second circuit board.

7. The inner module used in a wireless earphone, according to claim 6, wherein the inner module further comprises a power supply unit which is disposed in the holding space, and the power supply unit is connected with the circuit loop electrically.

8. The inner module used in a wireless earphone, according to claim 6, wherein the circuit loop further includes a third circuit board which is extended from the first circuit board to oppose the second circuit board, and the second side wall of the insulation seat further includes a second positioning slot to accommodate the third circuit board.

9. The inner module used in a wireless earphone, according to claim 8, wherein a first latching mechanism is further disposed between the second circuit board and the first positioning slot to latch the second circuit board and the first positioning slot together, allowing the second circuit board to be fixed in the first positioning slot through the first latching mechanism; and a second latching mechanism is further disposed between the third circuit board and the second positioning slot to latch the third circuit board and the second positioning slot together, allowing the third circuit board to be fixed in the second positioning slot through the second latching mechanism.

10. The inner module used in a wireless earphone, according to claim 6, wherein the inner module further comprises a loudspeaker which is connected with the circuit loop electrically, and the connecting wall of the insulation seat is further formed with a rabbet to accommodate the loudspeaker.

* * * * *